United States Patent
Steinberg et al.

(10) Patent No.: US 7,246,953 B2
(45) Date of Patent: Jul. 24, 2007

(54) OPTICAL DEVICE PACKAGE

(75) Inventors: Dan A. Steinberg, Blacksburg, VA (US); David W. Sherrer, Blacksburg, VA (US); Mindaugas F. Dautargas, Blacksburg, VA (US)

(73) Assignee: Shipley Company, L.L.C., Marlborough, MA (US)

( * ) Notice: Subject to any disclaimer, the term of this patent is extended or adjusted under 35 U.S.C. 154(b) by 2 days.

(21) Appl. No.: 11/080,002

(22) Filed: Mar. 15, 2005

(65) Prior Publication Data

US 2005/0180701 A1 Aug. 18, 2005

Related U.S. Application Data

(63) Continuation of application No. 09/966,973, filed on Sep. 28, 2001.

(60) Provisional application No. 60/249,794, filed on Nov. 16, 2000.

(51) Int. Cl.
*G02B 6/36* (2006.01)
(52) U.S. Cl. ............................. 385/92; 385/53; 385/88
(58) Field of Classification Search ............. 385/88–94
See application file for complete search history.

(56) References Cited

U.S. PATENT DOCUMENTS

| | | | |
|---|---|---|---|
| 3,404,215 A | 10/1968 | Burks et al. | |
| 3,768,991 A | 10/1973 | Rogers | |
| 3,874,549 A | 4/1975 | Hascoe | |
| 4,038,157 A | 7/1977 | Kim et al. | |
| 4,065,203 A | 12/1977 | Goell et al. | |
| 4,119,363 A | 10/1978 | Camlibel et al. | |
| 4,199,222 A | 4/1980 | Ikushima et al. | |
| 4,210,923 A | 7/1980 | North et al. | |
| 4,270,134 A | 5/1981 | Takeda et al. | |
| 4,411,057 A | 10/1983 | Duda et al. | |
| 4,611,884 A | 9/1986 | Roberts | |
| 4,791,075 A | 12/1988 | Lin | |
| 4,802,952 A | 2/1989 | Kobori et al. | |
| 4,818,058 A | 4/1989 | Bonanni | |
| 4,826,272 A | 5/1989 | Pimpinella et al. | |
| 4,897,711 A | 1/1990 | Blonder et al. | |
| 4,904,036 A | 2/1990 | Blonder | |
| 4,907,065 A | 3/1990 | Sahakian | |
| 5,071,213 A | 12/1991 | Chan | |
| 5,291,572 A | 3/1994 | Blonder et al. | |
| 5,313,546 A | 5/1994 | Toffetti | |
| 5,323,051 A | 6/1994 | Adams et al. | |
| 5,384,872 A | 1/1995 | Jacobs-Cook et al. | |
| 5,412,748 A | 5/1995 | Furuyama et al. | |
| 5,448,014 A | 9/1995 | Kong et al. | |
| 5,454,055 A | 9/1995 | Kragl et al. | |
| 5,475,778 A | 12/1995 | Webb | |
| 5,497,027 A | 3/1996 | Crafts | |

(Continued)

*Primary Examiner*—Jennifer Doan
(74) *Attorney, Agent, or Firm*—Jonathan D. Baskin

(57) ABSTRACT

An optical device package includes a substrate having a top portion with an a recess for receiving an optical semiconductor component and an elongated linear groove for receiving an optical fiber. The optical fiber is positioned within the groove in said substrate such that the top surface of the optical fiber is substantially at or below the upper surface of the substrate and the optical fiber is operatively aligned with the optical semiconductor component for the transfer of optical signals therebetween. A frame is hermetically sealed to the upper surface of the substrate.

20 Claims, 6 Drawing Sheets

U.S. PATENT DOCUMENTS

| | | |
|---|---|---|
| 5,504,372 A | 4/1996 | Braden et al. |
| 5,550,398 A | 8/1996 | Kocian et al. |
| 5,557,695 A | 9/1996 | Yamane et al. |
| 5,562,837 A | 10/1996 | De Givry |
| 5,604,160 A | 2/1997 | Warfield |
| 5,625,733 A | 4/1997 | Frigo et al. |
| 5,631,502 A | 5/1997 | Shimada |
| 5,635,761 A | 6/1997 | Cao et al. |
| 5,647,042 A | 7/1997 | Ochiai et al. |
| 5,656,552 A | 8/1997 | Hudak et al. |
| 5,671,315 A | 9/1997 | Tabushi et al. |
| 5,699,073 A | 12/1997 | Lebby et al. |
| 5,727,104 A | 3/1998 | Sasaki et al. |
| 5,734,555 A | 3/1998 | McMahon |
| 5,747,870 A | 5/1998 | Pedder |
| 5,774,614 A | 6/1998 | Gilliand et al. |
| 5,784,780 A | 7/1998 | Loo |
| 5,798,557 A | 8/1998 | Salatino et al. |
| 5,812,571 A | 9/1998 | Peters |
| 5,818,404 A | 10/1998 | Lebby et al. |
| 5,818,699 A | 10/1998 | Fukuoka |
| 5,915,168 A | 6/1999 | Salatino et al. |
| 5,917,976 A | 6/1999 | Yamaguchi |
| 5,933,558 A | 8/1999 | Sauvageau et al. |
| 5,949,654 A | 9/1999 | Fukuoka |
| 5,960,141 A | 9/1999 | Sasaki et al. |
| 5,966,488 A | 10/1999 | Miura et al. |
| 6,056,448 A | 5/2000 | Sauter et al. |
| 6,061,228 A | 5/2000 | Palmer et al. |
| 6,074,104 A | 6/2000 | Higashikawa |
| 6,106,735 A | 8/2000 | Kurle et al. |
| 6,130,979 A | 10/2000 | Isaksson et al. |
| 6,165,885 A | 12/2000 | Gaynes et al. |
| 6,207,950 B1 | 3/2001 | Verdiell |
| 6,221,753 B1 | 4/2001 | Seyyedy |
| 6,222,967 B1 | 4/2001 | Amano et al. |
| 6,228,675 B1 | 5/2001 | Ruby et al. |
| 6,318,909 B1 | 11/2001 | Giboney et al. |
| 6,318,910 B1 | 11/2001 | Higashikawa |
| 6,376,280 B1 | 4/2002 | Ruby et al. |
| 6,377,742 B1 | 4/2002 | Go |
| 6,406,196 B1 * | 6/2002 | Uno et al. .................... 385/89 |
| 6,441,481 B1 | 8/2002 | Karpman |
| 6,452,238 B1 | 9/2002 | Orcutt et al. |
| 6,585,426 B2 | 7/2003 | Shuto et al. |
| 6,611,001 B2 | 8/2003 | Cappuzzo et al. |
| 6,632,027 B1 | 10/2003 | Yoshida et al. |
| 6,635,866 B2 | 10/2003 | Chan et al. |
| 6,655,853 B1 | 12/2003 | Yap et al. |
| 6,764,875 B2 | 7/2004 | Shook |
| 6,818,464 B2 | 11/2004 | Heschel |
| 6,827,503 B2 | 12/2004 | Steinberg et al. |
| 2002/0090749 A1 | 7/2002 | Simmons |
| 2002/0113296 A1 | 8/2002 | Cho et al. |
| 2003/0095759 A1 | 5/2003 | Dautartas et al. |
| 2004/0012083 A1 | 1/2004 | Farrell et al. |
| 2004/0264866 A1 * | 12/2004 | Sherrer et al. .............. 385/49 |

* cited by examiner

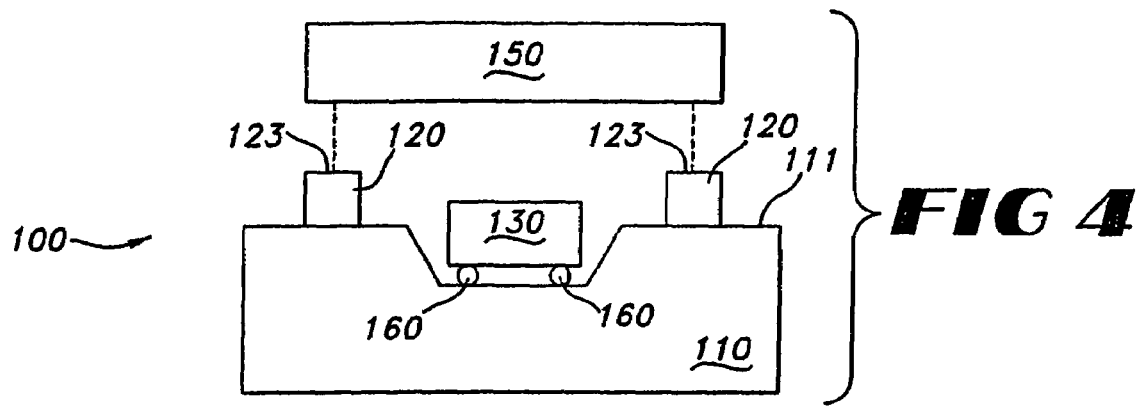
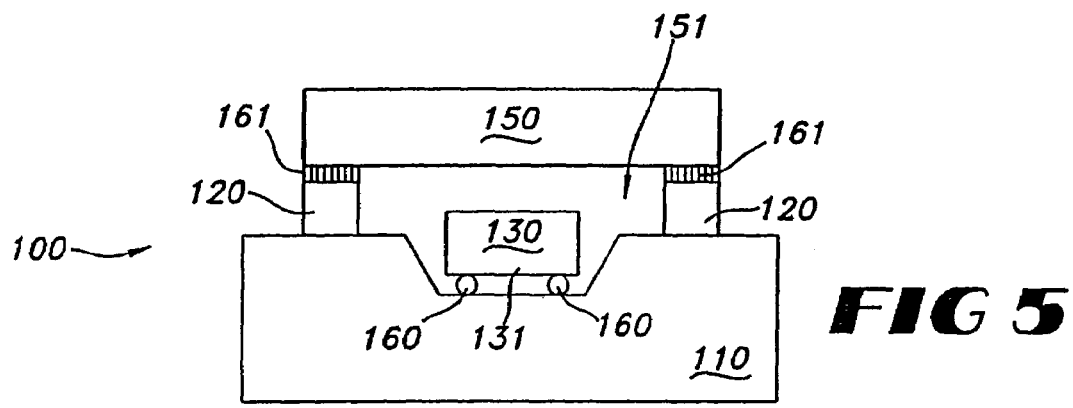
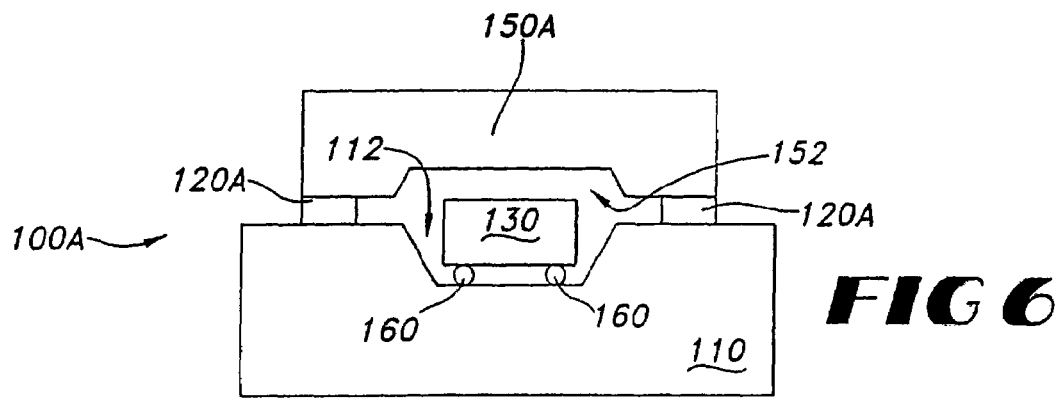

OPTICAL DEVICE PACKAGE

CROSS REFERENCE TO RELATED APPLICATIONS

This application is a continuation of application Ser. No. 09/966,973, filed Sep. 28, 2001, therethrough claiming priority to Provisional Application No. 60/249,794, filed Nov. 16, 2000.

BACKGROUND

1. Technical Field

The present disclosure relates to a package for optical devices, and particularly to a module for operatively coupling one or more optical fibers with one or more optical devices.

2. Description of the Related Art

Various optical devices are known in the art and include such semiconductor devices as light emitting diodes (LEDs), laser diodes, and photodetectors. Optical semiconductors, e.g., optoelectronic devices, effect a conversion between optical signals and electronic signals.

Optical semiconductor components are sensitive to environmental conditions and are generally sealed in hermetic packages or in plastic molding to prevent degradation caused by atmospheric contaminants such as humidity, dust, and free ions. The optical input/output surfaces of the components operatively coupled in a package are especially susceptible to contamination, hence, the desirability of hermetically sealing the package to prevent contact with the outside atmosphere. Hermetic sealing typically involves mounting a cap to a substrate having an optical semiconductor component by means of soldering, welding, and the like.

One prior known optical device module includes a submount body having a groove buried with an insulator, an optical semiconductor component mounted on the submount body, a cap arranged across the groove and fixedly bonded to the submount body by a bonding member for hermetically sealing the module. An electrical wiring layer connected to the semiconductor device extends to the outside of the cap through a groove buried with an insulator.

Another type of prior known optical device package includes a first substrate having a groove thereon into which an optical fiber is fitted, and a second groove to fix the optical fiber by applying adhesive, the second groove being formed on a part of the first groove, a width and a depth of the second groove being wider and deeper than those of the first groove so that the optical fiber is not in contact with the second groove. A second substrate pushes the optical fiber against the first groove.

A problem with the aforementioned prior known devices is that the optical axis must be above the top surface of the optical bench, i.e., the chip or substrate onto which the optical fiber is mounted, because the active area of the optical semiconductor component (e.g., a laser, photodetector, or the like) is above the optical bench surface. Therefore, the lid must have a a V-groove to accommodate the optical fiber. This creates problems during sealing because the alignment of the optical fiber can be disturbed during the sealing step. Moreover, it is more difficult to create a low temperature seal (which may be required due to the sensitivity of the semiconductor device to high temperature) when the lid must seal around the fiber.

Accordingly, it would be advantageous to have an optical device package wherein the lid does not require V-grooves to accommodate the optical fiber.

SUMMARY

An optical device package is provided herein which includes a substrate, an optical fiber and a frame. The substrate has an upper surface, and an elongated linear groove for receiving the optical fiber. The frame is mounted to the upper surface of the substrate. Optionally, an optical semiconductor component can be positioned within a recess in the upper surface of the substrate or mounted to the upper surface of the substrate. An optical fiber having an optical axis is positioned within the groove in the substrate such that the top surface of the optical fiber is at or below the level of the bottom surface of the frame. A lid can be hermetically sealed to the upper surface of the frame to provide an hermetically sealed enclosure.

The optical device package does not require the frame or lid to have a V-groove. This advantage simplifies the task of hermetically sealing the package and reduces the likelihood of disturbing the alignment of the optical fiber during the step of sealing the package.

BRIEF DESCRIPTION OF THE DRAWINGS

Various embodiments are described below with reference to the drawings wherein:

FIG. 4 is an exploded view of the section portion shown in FIG. 3 in conjunction with a lid;

FIG. 5 is a sectional view of an optical device package in accordance with this disclosure;

FIG. 6 illustrates an alternative embodiment of an optical device package in accordance with this disclosure;

DETAILED DESCRIPTION OF PREFERRED EMBODIMENT(S)

Figure 1:
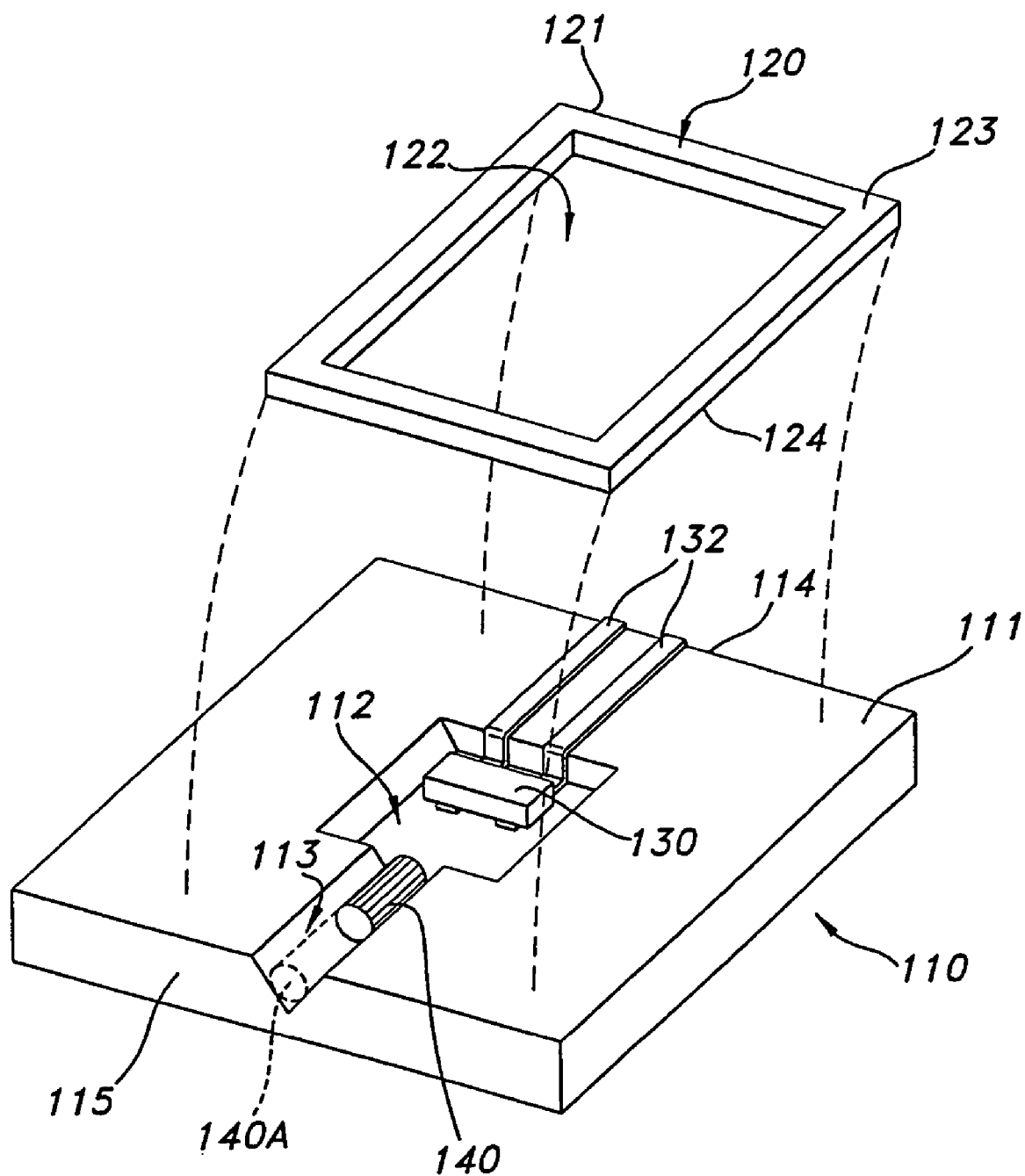
FIG. 1 is an exploded perspective view of a portion of an optical device package in accordance with this disclosure including a substrate, frame and optical components.
Figure 2:
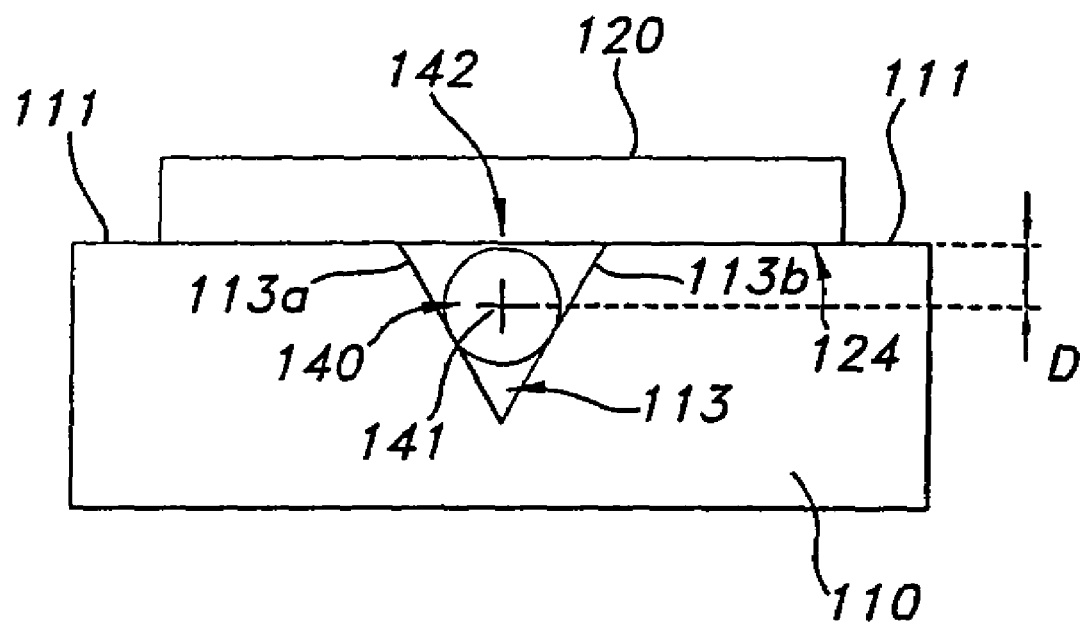
FIG. 2 is an end view of the portion shown in FIG. 1.
Figure 3:
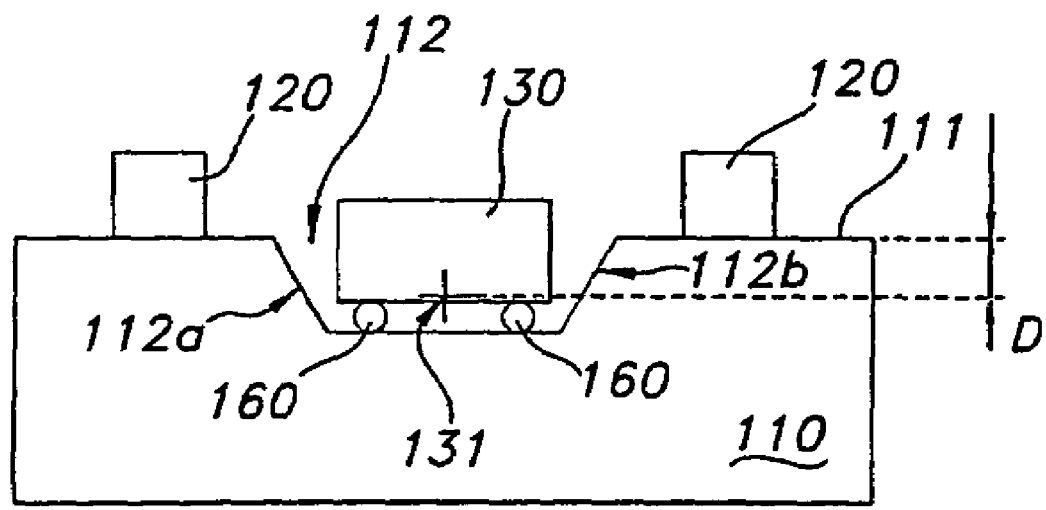
FIG. 3 is a sectional view of the portion shown in FIG. 1.

Referring to the drawings, FIGS. 1, 2 and 3 illustrate a substrate 110 in combination with an optical semiconductor component 130, an optical fiber stub 140, and a frame 120.

More particularly, substrate 110 can be any material suitable for providing an optical bench. A preferred material for fabricating substrate 110 is silicon. Other suitable materials include ceramics, polymers and metal. The substrate is formed by etching and/or cutting or other suitable method to provide a V-shaped notch 113 for receiving the optical fiber stub 140, and a recess 112 for receiving optical semiconductor component 130. Preferably, substrate 110 is (100) single crystal silicon having an upper surface 111. The upper surface can be masked and selectively etched to form angled surfaces 113a and 113b of the V-shaped notch 113 in the (111) crystallographic planes, and angled side edges 112a and 112b of recess 112. The depth of V-shaped groove 113 and recess 112 can be any suitable depth for accommodating the optical fiber 140 and the optical semiconductor component 130, and illustratively may range from about 50 microns to about 500 microns.

Optical fiber stub 140 can be any conventional optical fiber and is typically from about 1 mm to about 5 mm in length, although lengths outside of this range can also be employed when suitable. Optical fiber stub 140 typically has a diameter of about 125 microns (standard). Larger or smaller diameter fibers can also be used.

Optical fiber stub 140 can extend only part way along notch 113 or, alternatively, as indicated in phantom by reference numeral 140A, the optical fiber can extend from recess 112 to at least the distal end 115 of the substrate.

The optical semiconductor component 130 is an optional component and can be any suitable semiconductor device for emitting or receiving light, such as for example, a laser diode, light emitting diode (LED), or a photodetector. At least one, and preferably two, electrically conductive leads 132 extend from the optical semiconductor component along the top surface 111 of substrate 110 to at least the proximal edge 114 of the substrate so as to enable the optical semiconductor component to be electrically connected to a power source or various other components of an electrical circuit. Such optical semiconductor components are well known in the art. The electrical leads 132 are preferably formed as thin films from conductive materials such as aluminum or copper by, for example, vapor deposition, or other suitable technique.

Frame 120 is preferably an intermediate support structure fabricated from ceramic, glass, metal or silicon and includes a single piece member 121 having an inner edge which defines an opening 122, a planar upper surface 123, and a planar bottom surface 124. The single piece member 121 preferably has a band like structure and is preferably quadrilateral in shape although other shapes such as circular, oval, and the like are also contemplated as being within the scope of this invention. Frame 120 is preferably fabricated from a rigid material which does not plastically deform at the temperatures used to process and fabricate the present optical device package. Frame 120 can be of any suitable dimensions. Preferably, frame 120 is about 100 microns to about 1,000 microns in thickness.

Frame 120 is fixedly bonded to the upper surface 111 of the substrate such that opening 122 is over at least a portion of recess 112. Bonding of frame 120 to substrate 110 can be achieved by any suitable means such as soldering with metal, bonding with solder glass frit or BCB (benzocyclobutene resin), or adhesives such as epoxy resins, etc. The frame can be metallized or roughened, if necessary, to facilitate soldering or bonding.

Solder glass frit is a low melting point glass such as, for example, borate glass, lead zinc borate glass, and the like. Generally, solder glass frit can have a melting point of from about 300° C. to about 800° C., and typically from about 325° C. to 500° C. Solder glass frit suitable for use in the present invention is commercially available, for example, from Schott Glass Technologies of Duryea, Pa.

Preferably, electrical leads 132 are formed, optical fiber stub 140 is fixedly mounted in notch 113 and frame 120 is bonded to the substrate 110 prior to the incorporation of the optical semiconductor component 130 in the recess 112 of the substrate. Optical semiconductor component 130 is relatively more sensitive to high temperature and is more likely to be damaged by exposure to high temperature. Mounting optical fiber stub 140 and frame 120 to substrate 110 prior to mounting optical semiconductor component 130, allows the use of a relatively high temperature for bonding the frame 120 and optical fiber stub 140, and the subsequent use of a relatively lower temperature for bonding optical semiconductor component 130. The optical semiconductor component is preferably bonded to the electrical leads 132 by means of solder pads 160. In accordance with the preferred sequence of assembly, the optical fiber is already fixed in its position when the optical semiconductor component is added. Accordingly, the optical semiconductor component is actively aligned with the optical fiber as it is soldered or otherwise mounted to the electrical leads 132.

As can be seen from FIG. 2 and FIG. 3, groove 113 is configured and dimensioned such that substantially the entire optical fiber stub 140 is positioned below the level of the upper surface 111 of the substrate. The optical axis 141 of the optical fiber stub is positioned below the level upper surface 111 of the substrate by a distance D, which generally ranges from about 60 to 65 microns. Distance D can be greater than 65 microns, for example, if the top of the optical fiber is recessed below the level of substrate surface 111. Preferably, optical axis 141 is both below and parallel to the upper surface 111 of the substrate. The top surface 142 of the optical fiber is substantially at or below the plane of the bottom surface 124 of the frame. The top surface 142 of the optical fiber is also substantially at or below the level of upper surface 111 of the substrate, but may extend above the level of surface 111 of the substrate by, for example, 5 to 10 microns if a correspondingly thick layer of bonding material (e.g., solder glass frit) is used to mount the frame to the substrate. The optical port 131 of the optical semiconductor component 130 is an active area for the transfer of optical signals and is also positioned below the upper surface 111 of the substrate by distance D such that optical port 131 is at least substantially aligned with the optical axis 141.

Referring now to FIGS. 4 and 5, an optical device package 100 optionally includes a lid 150 which can be bonded to the upper surface 123 of frame 120 to form an enclosure 151. Together with frame 120, lid 150 forms a structure for sealing the optical components (optical fiber stub 140, optical semiconductor component 130, etc.) within enclosure 151. Lid 150 can be fabricated as a flat plate from any suitable fluid impervious material such as silicon, glass, ceramic, metal, and the like. Lid 150 can be bonded to frame 120 by any suitable means such as bonding with a bonding material such as solder metal, solder glass frit, adhesives such as epoxy, BCB, and the like. If an optical semiconductor component is present, lid 150 should be sealed at a temperature low enough to avoid thermal damage to the optical semiconductor component. FIG. 5 illustrates the use of a relatively thick layer 161 of bonding material. The upper surface 123 of frame 120 can optionally be metallized or roughened to facilitate adhesion of the bonding material. Upon completion of assembly, the electrical leads 132 can be electrically connected to an electric circuit (not shown) by conventional means.

Referring now to FIG. 6, in an alternative embodiment 100A of the optical device package lid 150A includes a recess 152 on a bottom surface. Recess 152 at least partially defines enclosure 151 and is adapted to accommodate optical semiconductor component 130. Frame 120A is similar to frame 120. However, because of the space provided by recess 152 in lid 150A it is possible to make frame 120A thinner than frame 120, without physically interfering with optical semiconductor component 130.

Figure 7:
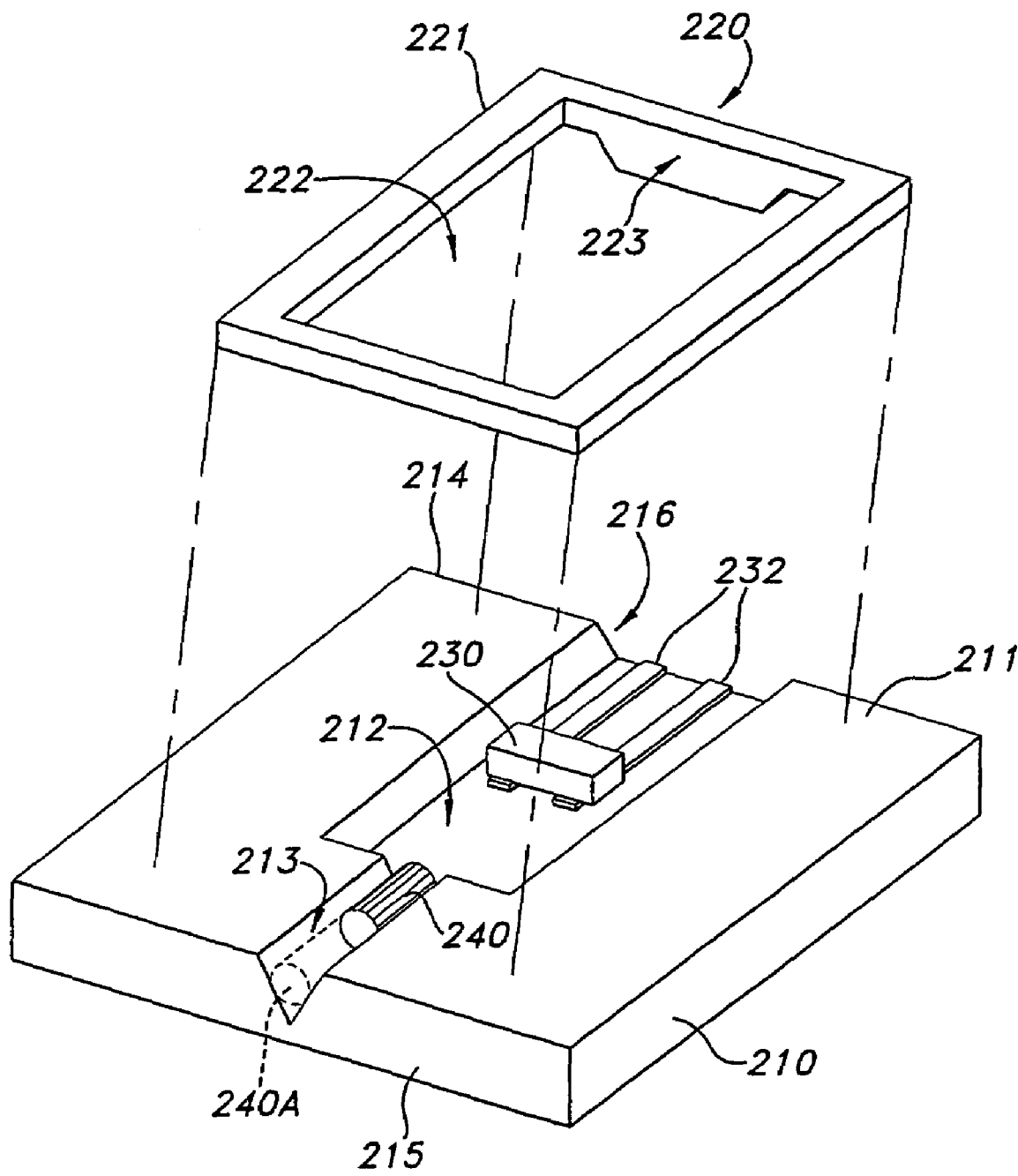
FIG. 7 illustrates in exploded perspective view the substrate, frame and optical components of yet another alternative embodiment of an optical device package in accordance with this disclosure.

Referring to FIG. 7, substrate 210 is fabricated from any suitable material for providing an optical bench, such as described about with respect to substrate 110. Substrate 210 has an upper surface 211, a proximal end 214, a distal end 215, a longitudinally extending rectilinear V-shaped groove 213 for receiving an optical fiber stub 240, and a recess 212 for receiving an optical semiconductor component 230. Optical fiber stub 240 can extend only part way along notch 213 or, alternatively, as indicated in phantom by reference numeral 240A, the optical fiber stub can extend to the distal end 215 of the substrate. Electrical leads 232 extend proximally from the optical semiconductor component 230 to at least the proximal end 214 of the substrate. Recess 212 extends to proximal end 214 of the substrate so as to have a proximal opening 216. Electrical leads 232 extend along the floor of recess 212, not along the upper surface 211 of the substrate 210.

Frame 220 is fabricated from a material such as one of those stated above with respect to frame 120. Frame 220 includes a single piece member 221 which defines an opening 222. Member 221 includes a lower projection 223 which is configured and dimensioned to engage recess 212 so as to form a proximal wall at least partially defining an enclosure in which the optical semiconductor component 230 is retained.

Frame 220 is bonded to substrate 210 in a manner as described above with respect to frame 120. Next, a lid (not shown) such as lid 150 is bonded to frame 220 in a manner such as described above to provide an optical device package.

As with optical device package 100, the optical axis of optical fiber stub 240 is below the level of the upper surface 211 of the substrate. The active area of the optical semiconductor component 230 is at least substantially aligned with the optical axis of the optical fiber stub 240 and is also below the level of the upper surface 211 of substrate 210.

Figure 8:
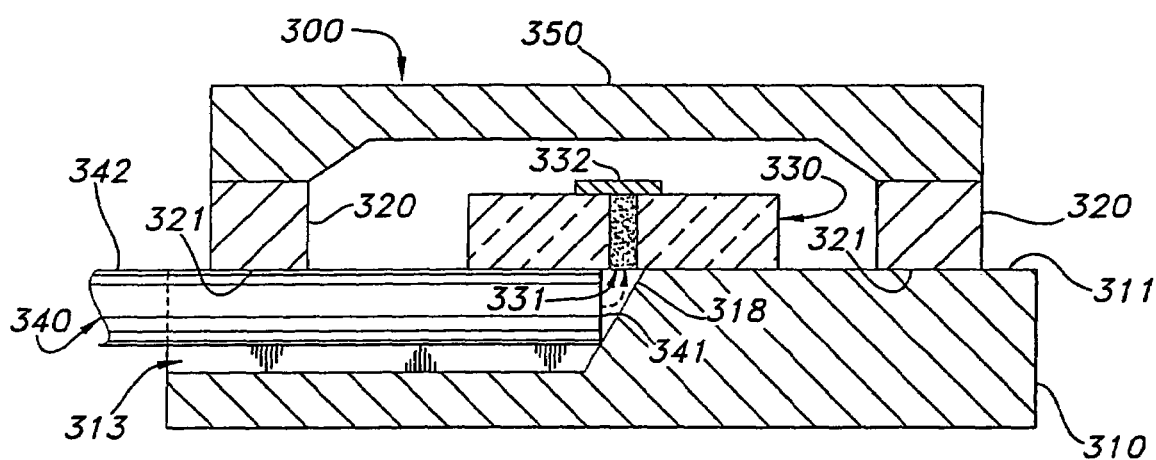
FIG. 8 is a sectional view illustrating an alternative embodiment of an optical device package in accordance with this disclosure.

FIG. 8 illustrates a further embodiment of the present invention. Optical device package 300 includes a substrate 310, optical fiber 340, frame 320, and optionally an optical semiconductor component 330 and lid 350. The optical device package 300 serves to provide for the coupling of optical signals between optical fiber 340 and optical semiconductor component 330. Optical semiconductor component 330 has an active, light emitting or light absorbing surface 331 (i.e., an optical port) on its lower surface, and a terminal 332 positioned on its upper surface. Optical semiconductor component 330 is positioned on substrate 310 that includes a groove 313 which is sized to receive optical fiber 340.

Groove 313 ends at a terminating surface 318 that is inclined at an angle with respect to the upper surface 311 of the substrate. Terminating surface 318 is coated with a suitable metal, so that the terminating face is reflective at the wavelengths at which the optical device package 300 will be operated. Optical fiber 340 is positioned in groove 313, with end 341 of the optical fiber being adjacent to terminating surface 318. Optical semiconductor component 330 is then positioned on substrate 310. Active area 331 of the optical semiconductor component, which serves as an optical port, is positioned directly above terminating face 318 and at, or above, the upper surface 311 of the substrate. As a result, light exiting from end 341 of optical fiber 340 is reflected upward by surface 318 such that it enters optical semiconductor component 330 at active area 331.

As described above, the upper surface 342 of the optical fiber is positioned at or below the level of the bottom surface 321 of the frame 320. Moreover, upper surface 342 of the optical fiber is generally at or below the level of upper surface 311 of the substrate, but may extend above the upper surface 311 by a distance corresponding to the thickness of a layer of bonding agent (e.g., solder glass, adhesive, etc.) applied to upper surface 311 to secure the frame 320 thereto, typically 5 to 10 microns, as mentioned above.

Figure 9:
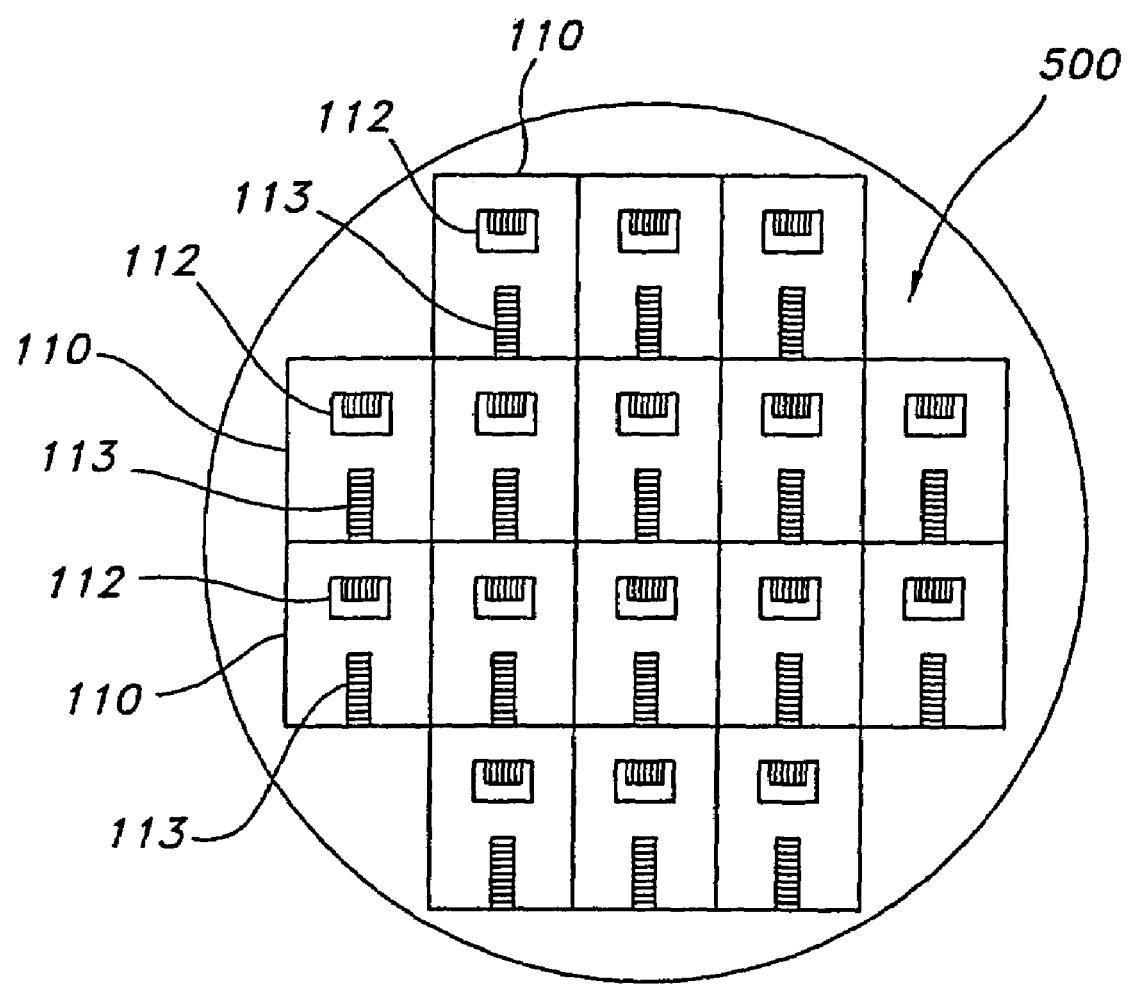
FIG. 9 is a plan view illustrating a wafer containing a plurality of optical device packages.

Referring now to FIG. 9, components for any of the embodiments of the optical device packages described herein can be fabricated in a batch process. For example, a plurality of substrates 110 can be simultaneously fabricated on a silicon wafer 500 by suitable masking, etching and bonding techniques as described above. In this manner, grooves 113 can be simultaneously formed batch-wise in the upper surfaces of substrate 110. Likewise, recesses 112 can be formed in a batch process. The frames and fiber stubs can be bonded to the substrates while they are connected in wafer form. Moreover, all the frames for an entire wafer can be part of a single piece that is attached to the wafer 500 in a single step. The individual substrates can thereafter be separated into individual units by cutting, sawing, dicing, cleaving or other suitable method of separation. Thus, in the embodiment shown in FIG. 9, sixteen substrates are simultaneously formed from a single, circular wafer 500.

While the above description contains many specifics, these specifics should not be construed as limitations on the scope of the invention, but merely as exemplifications of preferred embodiments thereof. Those skilled in the art will envision many other possibilities within the scope and spirit of the invention as defined by the claims appended hereto.

What is claimed is:

1. An optical device package which comprises:
    (a) a substrate having an upper surface and an elongated linear groove for receiving an optical fiber;
    (b) an optical fiber positioned within the groove in said substrate and having a top surface;
    (c) a frame comprising a flat bottom surface, wherein the flat bottom surface is sealed to the upper surface of the substrate, the top surface of the optical fiber being at or below the level of the bottom surface of the frame; and
    (d) a lid bonded to the frame.

2. The optical device package of claim 1, wherein the frame comprises a single piece member having a band-like structure defining an opening.

3. The optical device package of claim 2, wherein the lid comprises a plate of fluid impervious material, the plate being bonded to the frame so as to cover the opening of the frame.

4. The optical device package of claim 3, wherein the fluid impervious material is selected from the group consisting of silicon, glass, ceramic and metal.

5. The optical device package of claim 2, wherein the substrate has a distal end, a proximal end, and a recess for receiving an optical semiconductor component, the recess extending to the proximal end of the substrate.

6. The optical device package of claim 5, wherein the frame includes a projection dimensioned and configured to engage the recess.

7. The optical device package of claim 1, wherein the substrate has a distal end, a proximal end and a recess, and the optical fiber extends from the recess to at least the distal end of the substrate.

8. The optical device package of claim 1, wherein the substrate is fabricated from single crystal silicon.

9. The optical device package of claim 1, further including an optical semiconductor component mounted to the substrate.

10. The optical device package of claim 9, wherein the optical semiconductor component is selected from the group consisting of a laser diode, light emitting diode and photodetector.

11. The optical device package of claim 9, wherein the optical semiconductor component has an active area positioned below the upper surface of the substrate.

12. The optical device package of claim 9, wherein the optical semiconductor component has an active area positioned at or above the upper surface of the substrate, and the substrate possesses a reflecting surface for reflecting optical signals between the optical fiber and the active area.

13. An optical device package which comprises:
  (a) a substrate having an upper surface and an elongated linear groove for receiving an optical fiber;
  (b) an optical fiber positioned within the groove in said substrate and having a top surface; and
  (c) a frame comprising a flat bottom surface, wherein the flat bottom surface is sealed to the upper surface of the substrate, the frame being a single piece member having a band-like structure defining an opening, the top surface of the optical fiber being at or below the level of the upper surface of the substrate.

14. The optical device package of claim 13, further comprising a lid.

15. The optical device package of claim 13, wherein the substrate has a distal end, a proximal end, and a recess for receiving an optical semiconductor component, the recess extending to the proximal end of the substrate.

16. The optical device package of claim 13, wherein the substrate is fabricated from single crystal silicon.

17. The optical device package of claim 13, further including an optical semiconductor component mounted to the substrate.

18. The optical device package of claim 17, wherein the optical semiconductor component has an active area positioned below the upper surface of the substrate.

19. The optical device package of claim 17, wherein the optical semiconductor component has an active area positioned at or above the upper surface of the substrate, and the substrate possesses a reflecting surface for reflecting optical signals between the optical fiber and the active area.

20. An optical device package which comprises:
  (a) a substrate having an upper surface and an elongated linear groove for receiving an optical fiber;
  (b) an optical fiber positioned within the groove in said substrate and having a top surface; and
  (c) a frame comprising a single piece member having a band-like structure defining an opening and having a flat bottom surface, wherein the flat bottom surface is sealed to the upper surface of the substrate, the top surface of the optical fiber being at or below the level of the bottom surface of the frame.

* * * * *